United States Patent
Robello et al.

(10) Patent No.: US 6,969,578 B2
(45) Date of Patent: *Nov. 29, 2005

(54) OPTICAL RECORDING MATERIAL

(75) Inventors: Douglas R. Robello, Webster, NY (US); Samir Y. Farid, Rochester, NY (US); Joseph P. Dinnocenzo, Penfield, NY (US); Jason G. Gillmore, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 383 days.

This patent is subject to a terminal disclaimer.

(21) Appl. No.: 10/223,238

(22) Filed: Aug. 19, 2002

(65) Prior Publication Data

US 2004/0038146 A1 Feb. 26, 2004

(51) Int. Cl.$^7$ ................................................ G11B 7/24
(52) U.S. Cl. ..................... 430/270.14; 430/1; 430/2; 430/270.1; 359/2; 369/288
(58) Field of Search ................. 430/270.1, 270.11, 430/270.14, 1, 2; 359/2; 369/288

(56) References Cited

U.S. PATENT DOCUMENTS

| | | | | |
|---|---|---|---|---|
| 3,658,526 | A | * | 4/1972 | Haugh ............................ 430/1 |
| 4,298,678 | A | * | 11/1981 | McKeever ................. 430/281.1 |
| 4,491,432 | A | * | 1/1985 | Aviram et al. ............ 400/241.1 |
| 4,707,430 | A | * | 11/1987 | Ozawa et al. ........... 430/270.16 |
| 4,780,393 | A | * | 10/1988 | Frommeld .................. 430/292 |
| 5,185,233 | A | * | 2/1993 | Santo ........................ 430/270.1 |
| 5,759,721 | A | * | 6/1998 | Dhal et al. ....................... 430/1 |
| 6,221,536 | B1 | * | 4/2001 | Dhar et al. ...................... 430/1 |
| 6,569,600 | B2 | * | 5/2003 | Dinnocenzo et al. .. 430/270.15 |

FOREIGN PATENT DOCUMENTS

JP         2000-086588   *   3/2000   ......... C07C/69/753

OTHER PUBLICATIONS

English translation of Nishino et al.*

Robello, Farid, Dinnocenzo, Gillmore: "Quantum amplified isomerization: Photoinitiated electron transfer reactions in dewarbenzene substituted polymers" Conference Spring (Abstract Only) National ACS Meeting, Apr. 7–11, 2002, XP002969100 Orlando.

Natarajan LV et al: Liquid Crystalline Siloxanes Containing Spiropyran Chromophores as Reversible Optical Data Storage Materials, Advanced Materials for Optics and Electronics, Wiley and Sons Ltd, Chichester, GB, vol. 1, No. 6, Dec. 1, 1992, pps 293–297, XP000338534, ISSN: 1057–9257.

Tarkka Rm et al: "Holographic Storage in A Near–IR Sensitive Photochromic Dye", Optics Communications, North–Holland Publishing Co., Amsterdam, NL, vol. 109, No. 1/2, Jun. 15, 1994, pp. 54–58, XP000445924, ISSN: 0030–4018.

Fatema Ghailane et A: "Spiropyran–Doped Poly(Vinyl Carbazole): A New Photopolymer Recording Medium for Erasable Holography", Optical Engineering, Soc. of Photo–Optical Instrumentation Engineers, Bellingham, US, vol. 34, No. 2, Feb. 1, 1995, pp. 480–485, XP000490736, ISSN: 0091–3286.

* cited by examiner

*Primary Examiner*—Martin Angebranndt
*Assistant Examiner*—Jennifer R. Sadula
(74) *Attorney, Agent, or Firm*—Kathleen Neuner Manne

(57) ABSTRACT

An optical recording material which when exposed to actinic radiation produces a change in optical properties in the exposed regions, thereby providing a pattern of intelligence for storing and retrieving information, the recording material having: a) a polymer containing a covalently bound reactant moiety which is capable of undergoing a chemical transformation upon a one electron oxidation, thus causing the change in optical properties in the exposed regions; and b) a sensitizer capable of absorbing actinic radiation to cause an initial one electron oxidation of the reactant.

19 Claims, No Drawings

OPTICAL RECORDING MATERIAL

CROSS REFERENCE TO RELATED APPLICATION

Reference is made to commonly assigned, co-pending U.S. patent application Ser. No. 09/822,057 by Dinnocenzo et al., filed Mar. 30, 2001, entitled "Optical Recording Material".

FIELD OF THE INVENTION

This invention relates to an optical recording element which is capable of storing and retrieving information.

BACKGROUND OF THE INVENTION

The modem information revolution has led to an ever increasing demand for data storage systems. As a case in point, CD and DVD disks represent successful high volume data storage technologies. One major advantage of these technologies is that reading or writing of data is accomplished by shining light on the disk so there is no physical contact between the media and the optical head. However, the total storage capacity of these disks is limited by the size of the smallest marks on the surface of the media that can be read by the wavelength of light employed. Many attempts have been made to develop data storage systems with progressively smaller marks. However, the required equipment is prohibitively expensive, and the data access rates tend to be unacceptably slow.

One way to increase the storage capacity of a medium is to record the information depthwise, rather than just on the surface. There could be used holography, two-photon optics, and similar methods for illuminating media in three dimensions, with the goal of producing marks in three dimensions, and thereby providing very high data capacity systems.

Bleaching and photoreactions (e.g., photochromicity) of organic dyes have also been used as a means to record optical data, both in a single layer in writeable CD-type media, and depthwise (dissolved in a bulk piece of polymer). However, a large amount of optical power is required in these systems to produce readable marks, therefore the rate of recording of such media is slow. Also, many photochromic systems also tend to fade over time.

Holographic recording has also been achieved by optically induced birefringence in suitable polymers, a process which relies on photo-alignment of the side chains within the polymers. Once again, a large amount of optical power is required, and this process is inefficient and slow. In addition, the fidelity of the recorded information may degrade with time since optically induced orientation tends to relax over time in polymers.

JP 2000-086588 discloses a recording medium using changes in circular dichroism based on the interconversion of chiral norbornadiene and quadricyclane derivatives. However, this technique requires enantiomerically enriched compounds that are difficult to synthesize. Furthermore, this application does not disclose the use of sensitizers for photoinduced electron transfer.

U.S. Pat. No. 5,759,721 discloses a holographic recording medium which uses a photopolymerization technique which can also be used for recording information optically in three dimensions. There is a problem with this process, however, in that photopolymerization is usually accompanied by shrinkage of the material which is a consequence of the process of forming new chemical bonds among the constituents. Any dimensional changes that occur on writing limit the resolution that can be achieved, and reduce the data capacity of the medium. In addition, photopolymerization generally requires the use of low molecular weight reactants so that media made from these materials tend to be undesirably soft or sticky. Furthermore, the most common method of photopolymerization, free radical polymerization, is subject to interference by atmospheric oxygen which causes undesirable inconsistencies in the process.

It is an object of this invention to increase the storage capacity of a optical recording material. It is another object of this invention to provide an optical recording material which can record information depthwise, rather than just on the surface. It is still another object of this invention to provide an optical recording material which does not substantially change dimensions upon recording.

SUMMARY OF THE INVENTION

These and other objects are achieved in accordance with the invention which comprises an optical recording material which when exposed to actinic radiation produces a change in optical properties in the exposed regions, thereby providing a pattern of intelligence for storing and retrieving information, the recording material comprising:

a) a polymer containing a covalently bound reactant moiety, either as a side chain or within the polymer backbone, which is capable of undergoing a chemical transformation upon a one electron oxidation, thus causing the change in optical properties in the exposed regions; and b) a sensitizer capable of absorbing actinic radiation to cause an initial one electron oxidation of the reactant.

In accordance with the invention, an optical recording material is obtained which possesses several advantages over the prior art.

1. The invention involves a photoinitiated radical cation chain reaction in a solid polymer that creates changes in the optical properties of the material. However, because the invention relies on photoisomerization rather than photopolymerization, the dimensional changes accompanying recording are negligible. (No new bonds are formed between molecules.)

2. The invention involves a recording process that is efficient in the use of light. Because the process involves a photoinitiated chain reaction, many new molecules are formed per photon absorbed (chemical amplification). A relatively large change in optical properties is obtained with only a small exposure to the recording beam.

3. The material of the invention is a simple, stable polymer, which can be conveniently fabricated into films and slabs.

4. The optical changes in the material of the invention are large, permanent, localized, and can easily be detected, forming the basis for an optical storage medium. The invention is especially suited to three dimensional optical data recording systems such as holography and two-photon optics.

5. Unlike free radical polymerization, radical cation rearrangements of the invention are not sensitive to molecular oxygen, and will not be subject to the inconsistent performance which is commonly observed for free radical photopolymerizations that are currently used in the art.

6. Covalent attachment of the reactant moiety to a polymer (as opposed to simply dissolving the reactant in a polymer binder to form a solid solution) allows for the incorporation of much higher effective concentration of reactant without problems associated with phase separation such as crystallization. Higher concentrations of reactant moiety lead to desirable increases in changes in optical properties, thereby improving the performance of the media. In addition, the permanence of recorded information is improved due to low mobility of high molecular weight structures

DETAILED DESCRIPTION OF THE INVENTION

Any polymer may be used in the invention provided it is capable of forming covalent bonds to the reactant moiety. Suitable polymers include polymethacrylates, polyacrylates, polystyrenes, polyesters, polyamides, polyurethanes, polycarbonates, poyethers, cellulose esters, or poly(vinyl ester) derivatives, etc. In general, the polymer should be optically transparent in the spectral region where the sensitizer absorbs, i.e., should not have significant absorption at the excitation wavelengths, and should not interfere with the chemical transformation of the reactant. The polymer may be linear or branched.

The optical recording element of the invention may be in the form of a self-supporting slab or disk. It may also be coated on a support such as poly(ethylene terephthalate), poly(ethylene naphthoate), polycarbonate, polystyrene, cellulose acetate, inorganic supports such as glass, quartz, silicon, etc. In preferred embodiments, the support is a polyester or glass. The optical recording element of the invention may also contain optional ingredients such as a plasticizer, a preservative, etc.

The surface of the substrate may be treated in order to improve the adhesion of the recording layer to the support. For example, the surface may be corona discharge treated prior to applying the optical recording material. Alternatively, an under-coating or subbing layer, such as a layer formed from a halogenated phenol or a partially hydrolyzed vinyl chloride-vinyl acetate copolymer, can be applied to the surface of the support.

The recording layer thickness may range from about 1 μm to about 1 cm, preferably from about 20 μm to about 2000 μm.

As noted above, the reactant moiety used in the invention is capable of undergoing a chemical transformation upon a one electron oxidation, thus causing the change in optical properties in the exposed regions of the optical recording material. Such compounds undergo a photoinduced radical cation rearrangement to ultimately form a product species, a process which defines the recording event. With the product formation, there are accompanying changes in optical characteristics such as refractive index, fluorescence properties, or absorption spectrum. No new chemical bonds are formed between individual reactant moieties, therefore, there are negligible dimensional changes in the media during the recording event.

The reactant moiety is usually present in a relatively high concentration. In a preferred embodiment, the reactant moiety is covalently bound to about 10 to about 100% of the repeat units of said polymer. The sensitizer comprises from about 0.001 to about 10% by weight of the material, with the balance being the polymer plus any optional additives.

The chemical transformation of the reactant moiety is an isomerization including reactions such as cyclizations, cycloadditions and cycloreversions. General examples of such transformations are the interconversion between 1a and 1b or 2a and 2b.

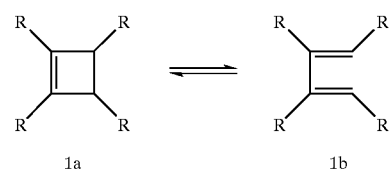

1a                1b

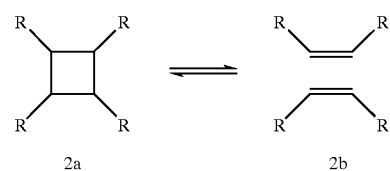

2a                2b

R in the formulas above and below can be H; a substituted or unsubstituted alkyl or alkoxy group having from about 1 to about 12 carbon atoms, preferably 1–3 carbon atoms, such as methyl, ethyl, isopropyl, butyl, etc; a cyano or a carboxylate group; a substituted or unsubstituted aryl group having from about 6 to about 18 carbon atoms, such as phenyl, naphthyl, phenanthryl, anthryl, etc.; a substituted or unsubstituted heteroaromatic group such as furyl, thienyl, pyridyl, benzofuryl, benzothienyl, etc. Substituents on the aryl or heteroaryl groups include, for example, one or more alkyl, aryl, alkoxyl, aryloxyl, thioalkyl, thioaryl groups etc. In addition, some or all of the substituents R can be joined together to form additional ring systems.

Examples of 1a/1b are:

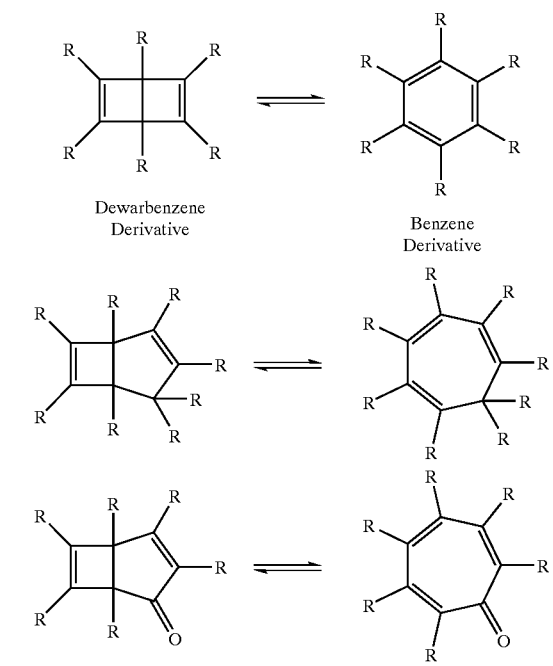

Examples of 2a/2b are:

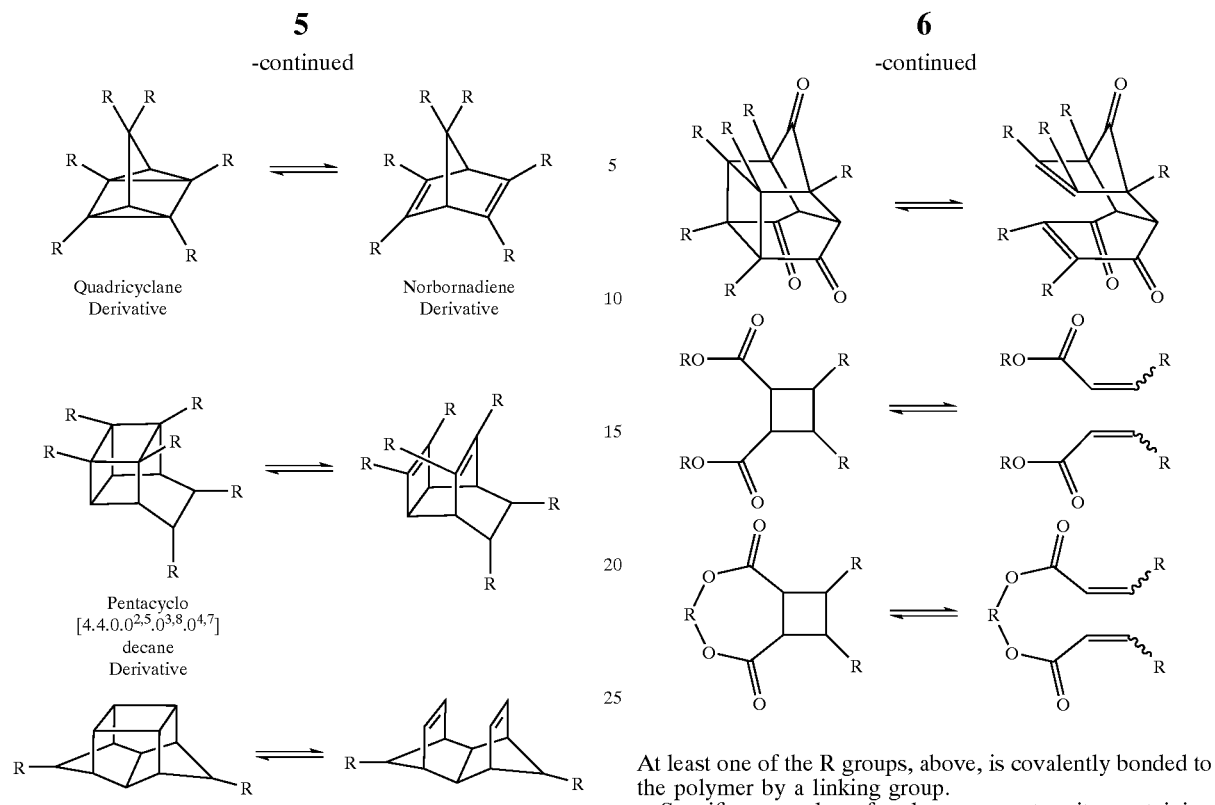
At least one of the R groups, above, is covalently bonded to the polymer by a linking group.
Specific examples of polymer repeat units containing reactant moieties 1a and 2a are shown in Table 1.
TABLE 1
| Reactants |
| --- |
| R-1 |
| R-2 |

TABLE 1-continued
| Reactants |
|---|
| R-3 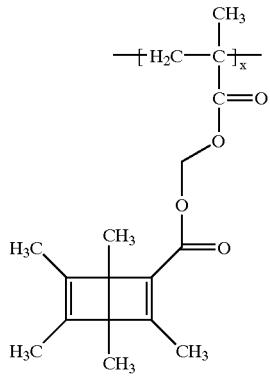 |
| R-4 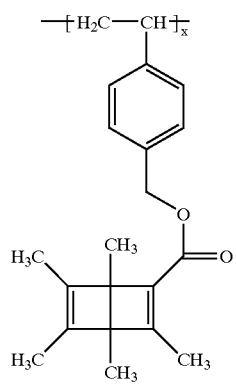 |
| R-5 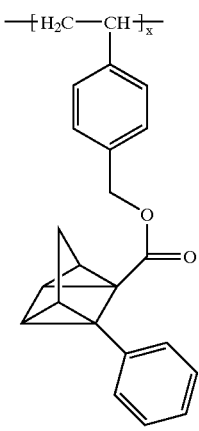 |
| R-6 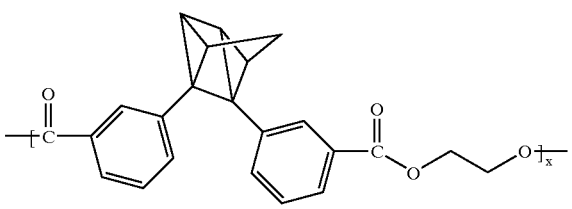 |

TABLE 1-continued
| | Reactants |
|---|---|
| R-7 | 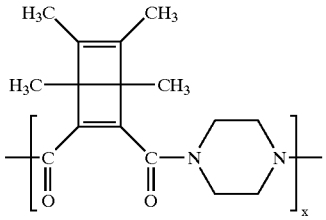 |
| R-8 | 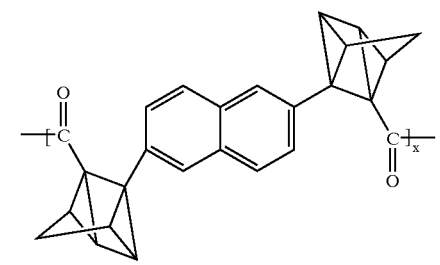 |
| R-9 | 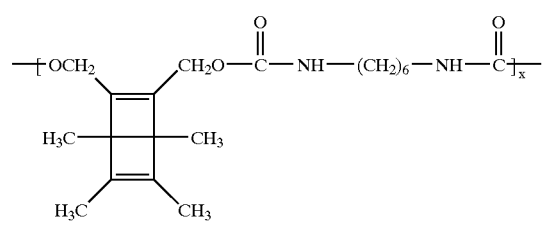 |
| R-10 | 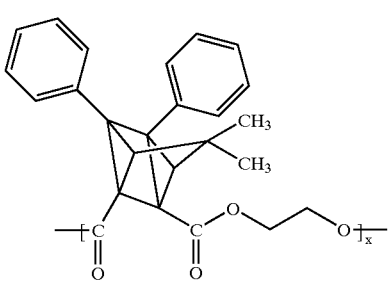 |
| R-11 | 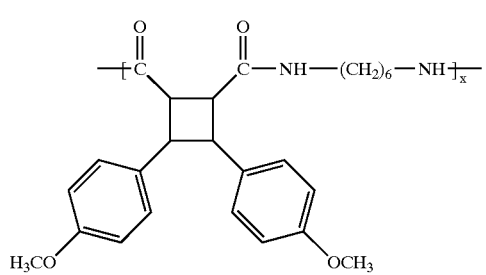 |
| R-12 | 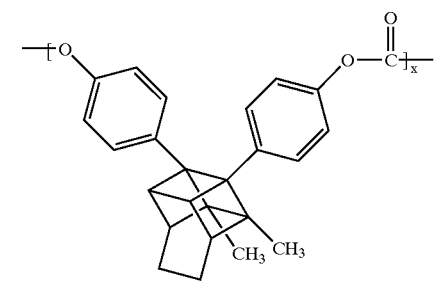 |

TABLE 1-continued

Reactants

R-13

[Chemical structure of R-13: a polymer with dimethyl-substituted cyclobutenyl carbonyl groups connected via methylene-phenoxy-methylene linkages]

In a preferred embodiment, the reactant moiety is selected so that its oxidation potential is less than that of its product, and that a suitably rapid isomerization can occur upon electron transfer to the sensitizer (see below). The moieties listed above possess these characteristics, but there may exist other (as yet unidentified) moieties that share the same properties, and that would function equally well or better than those listed.

The sensitizer used in the invention initiates the chemical transformation of the reactant moiety. The sensitizer must be capable of oxidizing the reactant to a radical cation after the sensitizer has absorbed light (i.e., photoinduced electron transfer). There are two distinct classes of sensitizers which may be used in the invention.

In one embodiment, the sensitizer upon absorption of the actinic radiation is capable of accepting an electron from the reactant moiety. Examples of such sensitizers include those shown in Tables 2 and 3.

In another embodiment of the invention, the sensitizer upon absorption of said actinic radiation fragments to give an oxidant capable of accepting an electron from the reactant moiety. Examples of such sensitizers include those shown in Table 4.

To determine whether a sensitizer is capable of oxidizing the reactant moiety to a radical cation after the sensitizer has absorbed light, reaction energetics may be used. There are three controlling parameters in reaction energetics: the excitation energy ($E_{S^*}$) and the reduction potential ($E_S^{red}$) of the sensitizing electron acceptor (S) and the oxidation potential ($E_R^{ox}$) of the reactant (R), an electron donor. For these reactions to be energetically feasible, the energy of the excited state should be higher or only slightly lower than the energy stored in the primary product, the radical ion pair, $S^{-*}R^{+*}$.

$$S \xrightarrow{h\nu} S^*$$
$$S^* + R \longrightarrow S^{\cdot-}R^{\cdot+}$$

The excitation energy of the sensitizer (electron acceptor) is conveniently determined from the midpoint of the normalized absorption and emission spectrum of S, if the reaction proceeds from the singlet excited state. However, if the reaction proceeds via the triplet state, then the triplet energy of S should be used as the excitation energy.

The energy of the radical ion pair, $E_{IP}$, is given by Eq. 1, where $\Delta$ is an energy increment that depends on the medium polarity and ranges from nearly zero in highly polar media to ca. 0.3 eV in the least polar media. The oxidation ($E_R^{ox}$) and reduction ($E_S^{red}$) potentials are readily obtained from conventional electrochemical measurements in polar solvents such as acetonitrile or methylene chloride.

$$E_{IP} = E_R^{ox} - E_S^{red} + \Delta \qquad \text{Eq. 1}$$

Polymeric media tend to be low in dielectric constant, and as a result would not strongly solvate the radical ion pair. Thus, the energy increment $\Delta$ in Eq. 1 is expected to be near the maximum value, i.e., in the range of 0.2 to 0.3 eV.

Thus, sensitizing electron acceptors with excitation energy equal to or larger than the difference between the oxidation potential of the reactant and the reduction potential of the acceptor, $$(E_R^{ox} - E_S^{red}),$$

will satisfy the energetic requirements of photoinitiating the reaction, Eq. 2.

$$E_{S^*} \geq E_R^{ox} - E_S^{red} \qquad \text{Eq. 2}$$

It is more convenient to express the energetic requirements of the sensitizing acceptor relative to the donor in terms of a rearranged form of Eq. 2.

$$E_{S^*} + E_S^{red} \geq E_R^{ox} \qquad \text{Eq. 3}$$

According to Eq. 3, for the reaction to be energetically feasible, the algebraic sum of the excitation energy of the sensitizer and its reduction potential should be approximately equal to or larger than the oxidation potential of the reactant.

For the specific example of the reactant hexamethyl Dewar benzene, which has an oxidation potential of 1.59 V vs. SCE, numerous sensitizing acceptors, which meet the requirement of Eq. 3, can be used. Listed in Table 2 are some of the compounds that meet the requirements, namely having the sum of excitation energy plus reduction potential that is equal to or exceeds 1.59 eV, and are therefore useful with hexamethyl Dewar benzene reactant moiety.

TABLE 2

| | Electron Transfer Sensitizers | $E_S^*$ | $E^{red}_S$ |
|---|---|---|---|
| S-1 | [1-cyanonaphthalene structure] | 3.85 | −1.88 |
| S-2 | [9,10-dicyanoanthracene structure] | 2.90 | −0.91 |
| S-3 | [N-methylquinolinium structure] | 3.53 | −0.85 |
| S-4 | [9,9-dicyclohexyl-N-methylacridinium structure] | 2.77 | −0.48 |

TABLE 2-continued

| | Electron Transfer Sensitizers | $E_S^*$ | $E^{red}_S$ |
|---|---|---|---|
| 5-5 | [2,4,6-triphenylpyrylium structure] | 2.84 | −0.40 |

In general, derivatives from many different compounds can be used as electron accepting sensitizers for various reactants, provided that the energetic requirements discussed above are satisfied. These potential sensitizers include: cyanoaromatics such as 1-cyanonaphthalene, 1,4-dicyanonaphthalene, 9,10-dicyanoanthracene, 2-t-butyl-9,10-dicyanoanthracene, 2,6-di-t-butyl-9,10-dicyanoanthracene, 2,9,10-tricyanoanthracene, 2,6,9,10-tetracyanoanthracene; aromatic anhydrides and imides such as 1,8-naphthylene dicarboxylic, 1,4,6,8-naphthalene tetracarboxylic, 3,4-perylene dicarboxylic, and 3,4,9,10-perylene tetracarboxylic anhydride or imide; condensed pyridinium salts such as quinolinium, isoquinolinium, phenanthridinium, acridinium salts; and pyryllium salts. Among useful sensitizers that involve the triplet excited state are carbonyl compounds such as quinones such as benzo-, naphtho-, anthro-quinones with electron withdrawing substituents (e.g., chloro and cyano). Ketocoumarins especially those with strong electron withdrawing moieties such as pyridinium can also be used as sensitizers.

Examples of the above sensitizers are shown in Table 3. These sensitizers can optionally contain substituents such as methyl, ethyl, tertiary butyl, phenyl, methoxy, chloro, etc. that may be included to modify properties such as solubility, absorption spectrum, reduction potential, etc.

TABLE 3

| | Electron Transfer Sensitizers |
|---|---|
| S-6 | [1,4-dicyanonaphthalene structure] |
| S-7 | [2,9,10-tricyanoanthracene structure] |

TABLE 3-continued

Electron Transfer Sensitizers

S-8, S-9, S-10, S-11, S-13, S-14, S-15, S-16, S-17, S-18

TABLE 3-continued

Electron Transfer Sensitizers

S-19

S-20

S-21

S-22

S-23

TABLE 3-continued

Electron Transfer Sensitizers

S-24

2) Sensitization via photochemical generation of a radical cation

In this approach, excitation leads to fragmentation of the sensitizer and the formation of an oxidizing radical cation. An example of this class of sensitizers is N-methoxyphenanthridinium, Eq. 4.

Eq. 4

Sensitizer

Fragent radical cation     Neutral fragment     Oxidized reactant

In the above illustration, the sensitizer upon absorption of actinic radiation reacts to produce a fragment radical cation, the fragment radical cation then accepts an electron from the reactant moiety, whereby the oxidation potential of the neutral fragment is approximately equally to or greater than that of the reactant.

TABLE 4

Radical Cation-Generating Sensitizers

S-25

TABLE 4-continued

Radical Cation-Generating Sensitizers

S-26 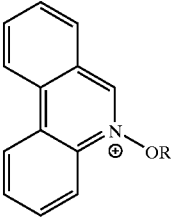

S-27 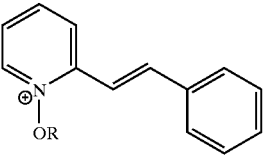

S-28 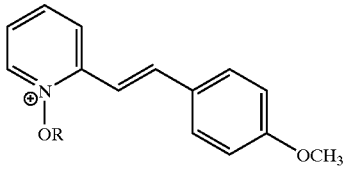

S-29 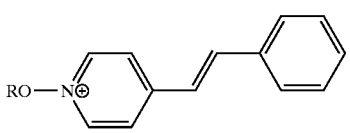

S-30 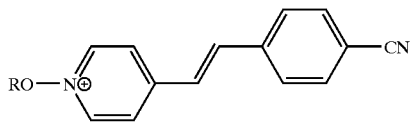

Where R = alkyl, substituted alkyl, aryl, or acyl.

The polymers of the invention can be prepared by one of three general methods. 1) A reactant is synthesized, bearing one or more moieties capable of undergoing polymerization reactions, for example, vinyl or acrylic ester groups, di(carboxylic acid) groups, etc. The polymer is then formed by a conventional polymerization reaction in the presence of a suitable initiator or catalyst. An optional comonomer bearing a compatible polymerizable functional group can be included in the reaction, and selected for the purpose of modifying the physical properties of the resulting polymer, for example, solubility or glass transition temperature. 2) A precursor polymer is first synthesized, bearing functional groups capable of subsequently forming covalent bonds to a reactant moiety, for example, a benzylic halide on the precursor polymer and a carboxylate group on the reactant. As before, optional comonomers can be included in the precursor polymer. The final polymer of the invention is then synthesized by reacting the precursor polymer with the appropriately functionalized reactant. 3) A different precursor polymer is first synthesized, bearing functional groups capable of subsequently transformed into the reactant moiety, for example, a carbon-carbon triple bond on the precursor polymer can be converted into a Dewar benzene derivative. Again, optional comonomers can be included in the precursor polymer.

The following examples further illustrate the invention.

EXAMPLES

Synthesis of Pentamethyl Dewar Benzylmethacrylate (Monomer 1)

First, ethyl pentamethyl Dewar benzoate was prepared. A stirred mixture under nitrogen of 34.2 g of aluminum chloride and 140 mL of dry dichloromethane was cooled in an ice bath and then treated dropwise with 26.3 g (486 mmol) of 2-butyne dissolved in 70 mL of dry dichloromethane. Remnants of the butyne solution were rinsed into the reaction vessel with an additional 25 mL of dichloromethane, and the resulting mixture was stirred for 20 min. The reaction mixture was added under nitrogen via double tipped needle to a solution of 20.1 g (179 mmol) of ethyl 2-butynoate in 70 mL of dry dichloromethane in a second reaction vessel, also cooled in an ice bath. The resultant deep red-brown clear solution was allowed to stir 15 min at 0° C., and then a solution of 70 mL of dimethyl sulfoxide (DMSO) and 170 mL of dichloromethane was added slowly. The reaction mixture was stirred for 45 min, and then was poured into 500 mL of ice water. The resulting mixture was twice extracted with pentane, and the combined organic extracts were washed three times with water and once with brine, then dried over sodium sulfate. The solvent was removed in vacuo to yield 45.9 g of a thin clear golden orange oil. The intermediate product was isolated by distillation at reduced pressure, collecting the fraction boiling at 63–67° C./0.03–0.05 mm. The yield was 28.5 g (72% of theoretical) The product was characterized by NMR. $^1$H NMR (CDCl$_3$): δ 1.20 (s, 3 H), 1.25 (s, 3 H), 1.30 (t, 3 H), 1.60 (s, 3 H), 1.65 (s, 3 H), 2.05 (s, 3 H), 4.20 (q, 4 H).

Next, pentamethyl Dewar benzyl alcohol was prepared. To a 26.0 g (118 mmol) sample of ethyl pentamethyl Dewar benzoate dissolved in 500 mL of dry ether at 0° C. under nitrogen was added over 40 min 250 mL of a 1.0 M solution of diisobutylaluminum hydride (250 mmol) in hexanes. The reaction mixture was stirred at 0° C. 1 h, and then at room temperature for 2 h. The mixture was cooled in an ice bath, and quenched by slow addition of 11 mL (8.7 g, 270 mmol) cold methanol. A saturated aqueous solution (200 mL) of sodium sulfate was added, plus an additional 100 mL of ether. Anhydrous magnesium sulfate was then added until a granular precipitate formed. The mixture was filtered, and the precipitate was washed with dry ether. The combined ethereal filtrates were concentrated to produce a clear pale yellow oil that slowly crystallized. Recrystallization from hexanes provided 13.0 g (62% of theory) of pentamethyl Dewar benzyl alcohol as a white crystalline solid, mp 57–58.5° C. The intermediate product was characterized by NMR. $^1$H NMR (CDCl$_3$): δ 1.1 (br s, 1H), 1.14 (s, 3 H), 1.18 (s, 3 H), 1.61 (s, 3 H), 1.64 (s, 3 H), 1.70 (s, 3 H), 4.15 (dd, 2 H).

A stirred solution of 5.80 g (32.5 mmol) of pentamethyl Dewar benzyl alcohol, 6.20 mL (4.50 g, 44.5 mmol) of triethylamine, 0.210 g (1.72 mmol) N,N-dimethylaminopyridine, and ca. 20 mg of inhibitor (bis-(3-tert-butyl-4-hydroxy-5-methylphenyl)sulfide) in 110 mL dichloromethane was treated under nitrogen with 3.30 mL (3.50 g, 33.8 mmol) methacryloyl chloride. After addition was complete, the reaction mixture was heated at reflux for 2.5 h, and then cooled to room temperature. The reaction mixture was diluted with 200 mL of ether, washed twice with water, once with saturated aqueous sodium bicarbonate, twice with 1 M aqueous sodium hydroxide, twice more with water, and once with brine. The solution was dried (Na$_2$SO$_4$), and solvent was removed in vacuo to produce a clear yellow oil. The product was purified by distillation at reduced pressure (bp 63° C., 0.05 mm Hg) to provide 7.05 g (88% of theory) of Monomer 1 as a clear colorless oil. The product was characterized by NMR. $^1$H NMR (CDCl$_3$): δ 1.15 (s, 3 H), 1.18 (s, 3 H), 1.60 (s, 3 H), 1.61 (s, 3 H), 1.75 (s, 3 H), 2.00 (s, 3 H), 4.66 (br s, 2 H), 5.60 (s, 1 H), 6.15 (s, 1 H).

Synthesis of Ethylene Glycol Pentamethyl Dewar Benzoate Methacrylate (Monomer 2)

First, 9H-fluorene-9-methanol 2-butynoate was synthesized. To a stirred solution of 2-butynoic acid (10.0 g, 0.12 mol), 9-fluorenemethanol (23.34 g, 0.12 mol), and 5.25 g (0.018 mol) of 4-dimethylpyridinium p-tosylate in 80 mL of dry dichloromethane cooled to 0° C. under argon was added dicyclohexylcarbodiimide (27.0 g, 0.13 mol) in small portions over 5 min. The mixture was stiller overnight, and gradually warmed to room temperature. The reaction mixture was filtered, diluted with 75 mL of additional dichloromethane, and successively washed with aqueous HCL, water, aqueous sodium bicarbonate, and water. The organic layer was dried over anhydrous sodium sulfate, filtered, and the solvent was removed by rotary evaporation. The resulting residue was subjected to flash column chromatography to isolate 22.0 g (70% of theory) of the product. The product was characterized by NMR. $^1$H NMR (CDCl$_3$) δ 7.8 (d, 2H), 7.65 (d, 2H), 7.45 (t, 2H), 7.35 (t, 2H), 4.4 (d, 2H), 4.25 (t, 1H), 2.05 (s, 3H).

Next, 9H-fluorene-9-methanol pentamethyl Dewar benzoate was synthesized. A reaction vessel was charged with 12.33 g (92 mmol) of aluminum chloride, 30 mL of dry dichloromethane under argon, and cooled to 0° C. A solution of 10.00 g (185 mmol) of 2-butyne in 30 mL of dichloromethane was added dropwise over a 15 minute period, and the resulting mixture was stirred for an additional 45 min. A solution of 9H-fluorene-9-methanol 2-butynoate (12.12 g, 46 mmol) in 30 mL methylene chloride was added dropwise over 10 min, and the resulting mixture was stirred for an additional 10 min. A solution of 30 mL of dimethylsulfoxide (DMSO) and 30 mL of dichloromethane was added dropwise to the reaction mixture over a 15 minute time period. The reaction mixture was warmed to room temperature, diluted with an equal volume of ligroin, and washed successively with water and brine. The organic layer was dried over anhydrous sodium sulfate, filtered and solvent was removed in vacuo to deposit a yellow solid. This yellow solid was recrystallized from methanol in two crops to give 13.0 g of this intermediate product as colorless needles (68.3% of theory).

Next, pentamethyl Dewar benzoic acid was synthesized. 9H-fluorene-9-methanol pentamethyl Dewar benzoate (2.00 g, 5.0 mmol) was dissolved in 10 mL of dry methylene chloride. Piperidine (1.82 g, 21 mmol) was added via syringe over 3 minutes while stirring the reaction at room temperature, and then the mixture was allowed to stir at room temperature overnight. The mixture was washed with aqueous 10% HCl. Ligroin (20 mL) was added, and the organic layer was washed with aqueous sodium bicarbonate (6×30 mL), followed by 5% aqueous potassium hydroxide (3×30 mL). All aqueous layers were combined and acidified to pH=1 with 10% aqueous HCl. The resulting white precipitate was collected, washed with deionized water, and then dried in vacuo at 40° C. This intermediate product was obtained as 763 mg of white powder (73% yield).

Finally, Ethylene glycol pentamethyl Dewar benzoate methacrylate was synthesized as follows. To a solution of pentamethyl Dewar benzoic acid (500 mg, 3.0 mmol), 2-hydroxyethyl methacrylate (340 mg, 3.0 mmol), 4-diethylaminopyridinium p-toluene sulfonate (150 mg, 1.0 mmol), and 3 mL dry dichloromethane cooled to 0° C. under argon was added dicyclohexylcarbodiimide (0.62 g, 3.0 mmol) in small portions over 5 min. The mixture was stiller overnight, and gradually warmed to room temperature. The reaction mixture was filtered, diluted with 25 mL of additional dichloromethane, and successively washed with aqueous HCL, water, aqueous sodium bicarbonate, and water. The organic layer was dried over anhydrous sodium sulfate, filtered, and the solvent was removed by rotary evaporation. The resulting residue was subjected to flash column chromatography to isolate 420 mg (50% of theory) of Monomer 2. The product was characterized by NMR. $^1$H NMR (CDCl$_3$) δ 1.14 (s, 3H), 1.20 (s, 3H), 1.57 (s, 3H), 1.58 (s, 3H), 1.93 (s, 3H), 1.99 (s, 3H), 4.35 (m, 4H), 5.57 (m, 1H), 6.12 (br s, 1H).

Synthesis of 5% Dewar Benzene Containing Copolymer with Methyl Methacrylate (Polymer 1)

A solution of 1.14 g (4.63 mmol) of Monomer 1, 8.87 g (88.6 mmol) of methyl methacrylate, and 0.44 g (2.29 mmol) of azobisisovaleronitrile (initiator) in 50 mL of chlorobenzene was deaerated by sparging with nitrogen for 10 min, and then heated at 65–70° C. for 24 h. The resulting polymers were precipitated into excess methanol, and subsequently dissolved in dichloromethane and reprecipitated into excess methanol. The resulting polymer was collected and dried in vacuo to produce 5.05 g of Polymer 1. The molecular weight distribution was measured by size-exclusion chromatography (SEC) using polystyrene standards and tetrahydrofuran solvent. $\overline{M}_n$=27,400; $\overline{M}_w$=46,000. The glass transition temperature was found to be 120° C. by differential scanning calorimetry (DSC), measured in a nitrogen atmosphere at a heating rate of 10° C./min.

Synthesis of 10% Dewar Benzene Containing Copolymer with Methyl Methacrylate (Polymer 2)

The procedure for Polymer 1 was repeated using 4.29 g (17.4 mmol) of Monomer 1, 15.7 g (157 mmol) of methyl methacrylate, 0.85 g (4.42 mmol) of azobisisovaleronitrile, and 100 mL of chlorobenzene. The yield was 11.6 g. $\overline{M}_n$=27,100; $\overline{M}_w$=46,900. $T_g$=115° C.

Synthesis of 25% Dewar Benzene Containing Copolymer with Methyl Methacrylate (Polymer 3)

The procedure for Polymer 1 was repeated using 2.25 g (9.13 mmol) of Monomer 1, 2.75 g (27.5 mmol) of methyl methacrylate, 0.17 g (0.88 mmol) of azobisisovaleronitrile, and 25 mL of chlorobenzene. The yield was 1.64 g.

Synthesis of 50% Dewar Benzene Containing Copolymer with Methyl Methacrylate (Polymer 4)

The procedure for Polymer 1 was repeated using 3.00 g (12.2 mmol) of Monomer 1, 1.22 g (12.2 mmol) of methyl methacrylate, 0.23 g (1.2 mmol) of azobisisovaleronitrile, and 21 mL of chlorobenzene.

Synthesis of Dewar Benzene Containing Homopolymer (Polymer 5)

The procedure for Polymer 1 was repeated using 7.01 g (28.5 mmol) of Monomer 1, 0.28 g (1.46 mmol) of azobisisovaleronitrile, and 35 mL of chlorobenzene. The yield was 4.86 g.

Synthesis of 10% Dewar Benzene Containing Copolymer with n-butyl Methacrylate (Polymer 6)

The procedure for Polymer 1 was repeated using 1.61 g (6.5 mmol) of Monomer 1, 8.39 g (59 mmol) of n-butyl methacrylate, 0.32 g (1.3 mmol) of azobisisovaleronitrile, and 50 mL of chlorobenzene. The yield was 4.05 g.

Synthesis of 10% Dewar Benzene Containing Copolymer with Cyclohexyl Methacrylate (Polymer 7)

The procedure for Polymer 1 was repeated using 0.99 g (4.02 mmol) of Monomer 1, 6.11 g (36.3 mmol) of cyclohexyl methacrylate, 0.38 g (1.98 mmol) of azobisisovaleronitrile, and 35 mL of chlorobenzene. The yield was 6.22 g. $\overline{M}_n$=12,900; $\overline{M}_w$=43,500. $T_g$=106° C.

Synthesis of 10% Dewar Benzene Containing Copolymer with Methacryonitrile (Polymer 8)

The procedure for Polymer 1 was repeated using 2.03 g (8.2 mmol) of Monomer 1, 4.97 g (74.1 mmol) of methacrylonitrile, 0.79 g (4.11 mmol) of azobisisovaleronitrile, and 35 mL of chlorobenzene. The yield was 2.51 g. $\overline{M}_n$=2730; $\overline{M}_w$=3710. $T_g$=86° C.

Synthesis of 10% Dewar Benzene Containing Copolymer with n-hexyl Methacrylate (Polymer 9)

The procedure for Polymer 1 was repeated using 0.98 g (3.98 mmol) of Monomer 1, 6.12 g (35.9 mmol) of n-hexyl methacrylate, 0.38 g (1.98 mmol) of azobisisovaleronitrile, and 35 mL of chlorobenzene. $\overline{M}_n$=19,800; $\overline{M}_w$=44,000. $T_g$=4° C.

Synthesis of 10% Dewar Benzene Containing Copolymer with 2-Phenoxyethyl Methacrylate (Polymer 10)

The procedure for Polymer 1 was repeated using 1.17 g (4.75 mmol) of Monomer 1, 8.84 g (42.9 mmol) of 2-phenoxyethyl methacrylate, 0.23 g (1.20 mmol) of azobisisovaleronitrile, and 50 mL of chlorobenzene. The yield was 8.95 g.

Synthesis of 25% Dewar Benzene Containing Copolymer with 2-Phenoxyethyl Methacrylate (Polymer 11)

The procedure for Polymer 1 was repeated using 2.25 g (9.13 mmol) of Monomer 1, 7.75 g (37.6 mmol) of 2-phenoxyethyl methacrylate, 0.23 g (1.20 mmol) of azobisisovaleronitrile, and 50 mL of chlorobenzene. The yield was 8.76 g.

Synthesis of 10% Dewar Benzene Containing Copolymer with Ethyl Methacrylate (Polymer 12)

The procedure for Polymer 1 was repeated using 1.96 g (7.92 mmol) of Monomer 1, 8.08 g (70.8 mmol) of ethyl methacrylate, 0.38 g (1.98 mmol) of azobisisovaleronitrile, and 50 mL of chlorobenzene. The yield was 0.3 g. $\overline{M}_n$=68,100; $\overline{M}_w$=68,100. $T_g$=78° C.

Synthesis of Dewar Benzene Containing Homopolymer (Polymer 13)

The procedure for Polymer 1 was repeated using 0.63 g (2.1 mmol) of Monomer 2, 0.010 g (0.040 mmol) of azobisisovaleronitrile, and 4 mL of chlorobenzene. The yield was 0.46 g.

Synthesis of 10% Dewar Benzene Containing Copolymer with Methyl Methacrylate (Polymer 14)

The procedure for Polymer 1 was repeated using 1.25 g (4.1 mmol) of Monomer 2, 3.74 g (37.4 mmol) of methyl methacrylate, 0.05 g (0.3 mmol) of azobisisovaleronitrile, and 60 mL of chlorobenzene. The yield was 5.0 g.

Synthesis of Quadricyclane Substituted Polystyrene (Polymer 15)

First, ethyl 2-phenylnorbornadiene-1-carboxylate was synthesized. A heavy-walled glass tube was charged with ethyl phenylpropiolate (5.0 g, 29 mmol), 2.85 g (43 mmol) of freshly distilled cyclopentadiene, 5 mL of xylenes, and 20 mg of 3,3'-di-t-butyl-4,4'-dihydroxy-6,6'-dimethyl diphenyl sulfide, and sealed under argon. The tube was heated for 48 h at 175° C., and then cooled. The product was isolated by fractional distillation at reduced pressure to provide 3.1 g (45% of theoretical) of ethyl 2-phenylnorbornadiene-1-carboxylate, bp 92–107° C./0.05 mm. This intermediate product was characterized by NMR and by mass spectroscopy. $^1$H NMR (CDCl$_3$) δ 1.21 (t, 3 H), 2.06 (m, 1 H), 2.24 (m, 1 H), 3.85 (m, 1 H), 4.06 (m, 1 H), 4.14 (qt, 2 H), 6.92 (m, 1 H), 6.98 (m, 1 H), 7.25 (m, 3 H), 7.52 (m, 2 H). Electrospray mass spectroscopy showed the molecular ion at m/e 241$^+$.

Next, 2-phenyl-norbornadiene-1-carboxylic acid was synthesized. Ethyl 2-phenyl-norbornadiene-1-carboxylate (5.0 g) was combined with 3.8 g of potassium hydroxide in 50 mL of methanol. This solution was stirred at gentle reflux for 16 hours. All methanol was then removed by rotary evaporation, and the resulting residue was dissolved in 75 mL water. To this solution was added 10% HCl (aq) dropwise until the pH of the solution was acidic. The resulting yellow solid was collected by filtration. Recrystallization of this residue from isopropyl alcohol/water (40/60) gave 2.6 g of colorless needles in two crops (60% of theoretical). This intermediate product was characterized by NMR and by mass spectroscopy. $^1$H NMR (CDCl$_3$) δ 7.54–7.50 (m, 2H); 7.39–7.32 (m, 3H); 7.02–6.99 (m, 1H); 6.93–6.90 (m, 1H); 4.08 (s, 1H); 3.87 (s, 1H); 2.27 (d, 1H); 2.08 (d, 1H).

A norbornadiene-substituted intermediate polymer was prepared as follows. 2-phenyl-norbornadiene-1-carboxylic acid (1.2 g) was titrated in methanol to the phenolphthalein end point with methanolic potassium hydroxide. Methanol was then removed via rotary evaporation, and the residue was then combined with 25 mL of N,N-dimethyl formamide (DMF), 300 mg tetrabutylammonium bromide, and 950 mg of poly(chloromethylstyrene). The mixture was stirred at 50° C. overnight, and then was poured into 500 mL of rapidly stirred methanol. The resulting white precipitate was collected by filtration, and dried in a vacuum oven at 40° C. Analysis of the polymer (1.6 g, 77% yield) by $^1$H NMR showed ~90% substitution (CDCl$_3$) δ 7.4 (br. s, 2H); 7.2–7.1 (br. m, 3H); 7.0–6.6 (br. s, 4H); 6.5–6.0 (br. s, 2H): 5.0–4.6 (br. s, 2H); 4.4–4.0 (br. s, 0.2H); 4.05–3.9 (br. m, 1 H); 3.85–3.7 (br. s, 1 H); 2.1–1.0 (br. m, 5H)

The final quadricyclane-substituted polymer of the invention (Polymer 10) was synthesized as follows. The norbornadiene substituted polystyrene above (1.5 g) was dissolved in 50 mL chloroform, poured into a long glass tube, and sparged with Ar for 20 minutes. The tube was then capped and exposed to ultraviolet light from 350 nm bulbs in a Rayonet photochemical reactor for 18 h at room temperature. Upon completion of the irradiation, the polymer solution was concentrated to approximately 10 mL and dripped slowly into 200 mL of rapidly stirred methanol. The resulting slightly yellow precipitate (1.0 g, 68% yield) was collected by filtration, dried overnight in vacuo at 30° C., and analyzed via $^1$HNMR (CDCl$_3$) δ 7.2–6.0 (br. m, 9 H); 5.0–4.6 (br. m, 2 H); 2.5–1.0 (br. m, 9 H).

Synthesis of Dewar Benzene Substituted Polystyrene (Polymer 16)

First, 1,3,4,5,6-pentamethyl-Dewar benzene-2-carboxylic acid was synthesized. Ethyl 1,3,4,5,6-pentamethyl Dewar benzoate (5.0 g) was combined with 3.80 g of potassium hydroxide in 50 mL methanol. This solution was stirred at gentle reflux for 16 hours. All methanol was then removed by rotary evaporation, and the resulting residue was dissolved in 75 mL water. To this solution was added 10% HCl (aq) dropwise until the pH of the solution was acidic. The resulting white precipitate was collected by vacuum filtration and dried in a vacuum desiccator overnight to yield 3.70 g of dry white solid (85% yield). The product was analyzed by $^1$H NMR (CDCl$_3$) δ 2.04 (s, 3H); 1.62 (m, 3H); 1.58 (m, 3H); 1.24 (s, 3H); 1.16 (s, 3H).

The final Dewar benzene-substituted polymer of the invention was synthesized as follows. The compound 1,3,4,5,6-pentamethyl Dewar benzene-2-carboxylic acid (1.2 g) was titrated in methanol to the phenolphthalein end point with methanolic potassium hydroxide. Methanol was then removed via rotary evaporation, and the residue was combined with 25 mL of N,N-dimethyl formamide (DMF), 300 mg of tetrabutylammonium bromide, and 950 mg of poly(chloromethylstyrene). The solution was stirred at 50° C. overnight, and then was poured into 500 mL of rapidly stirred methanol. The resulting white precipitate was collected by filtration, and dried in a vacuum oven at 40° C. The polymer (1.50 g, 78%) was characterized by $^1$H NMR to be quantitatively substituted (CDCl$_3$) δ 7.2–6.8 (br. s, 2H); 6.6–6.1 (br s, 2H); 5.1–4.8 (br s, 2H); 2.1–1.1 (br m, 18 H).

Optical Recording Procedure

An experimental apparatus was used consisting of an interferometer to write a holographic grating in a sample element and a rotation stage and probe beam to measure the angular spectrum of the grating. The light source for the interferometer was a violet krypton-ion laser beam at a wavelength of 406 nm. This laser beam was spatially filtered with a 10× microscope objective and a 5 μm pinhole before being collimated in a 7.5 mm diameter beam by a 50 mm focal length fused silica lens. This beam defined the optical axis of the apparatus. A phase mask with a period of 1070 nm dispersed the beam according to the grating equation. The zero-order beam was blocked so that it could not reach the sample plane.

The first-order diffracted beams, which define the plane of incidence, each propagated away from the grating at an angle of 19.15° with respect to the optical axis. Two plane mirrors, positioned approximately 23 cm. from the phase mask as measured along the optical axis, directed the first-order diffracted beams to the film plane where they intersected at an angle of 32.19°. The sample plane was positioned 50 cm. from the phase mask, as measured along the optical axis. The optical axis was normal to the film plane and bisected the 32.19° angle made by the interfering beams. The fringe pattern formed by the interfering beams was sinusoidal with a period of 633 nm.

The light source for the probe beam was a helium-neon laser beam at a wavelength of 6328 Å. The probe beam was polarized perpendicularly to the plane of incidence. This laser beam was spatially filtered with a 10× microscope objective and a 25 μm pinhole before being collimated in a 3.0 mm diameter beam by a 5× microscope objective. The probe beam was modulated at 1400 Hz by a chopper wheel so that a lock-in amplifier could be used for low noise detection. The probe beam intersected the sample plane at an angle of 30.00° with respect to the optical axis. This angle satisfied the Bragg condition for maximum diffraction efficiency. The sample was mounted on a rotation stage so that the diffraction efficiency of the holographic grating could be measured as a function of angular detuning from the Bragg angle.

A measurement of the exposure characteristics of a sample element began with an alignment check of the apparatus. A microscope slide was placed in the sample plane and the back-reflections from its surface were used to verify that the sample plane was normal to the optical axis, that the probe beam was incident at 30.00°, that the violet beams were intersecting at an angle of 32.19°, and that the optical axis bisected the angle made by the beams. Once this alignment was completed, the krypton-ion laser power was adjusted such that the power in each of the interfering violet beams was 8 mW. The power of the probe beam was measured in Volts by the lock-in amplifier so that the diffraction efficiency measurements could be normalized.

The writing procedure was as follows. The violet beams were blocked with a shutter while the sample was clamped in position. The apparatus was allowed to relax for a minimum of 60 sec so that the mechanical and thermal disturbances caused by the alignment procedure could decay. The sample was then exposed to the interfering violet beams for a predetermined length of time while a computer recorded the power of the diffracted probe beam. At the end of the exposure, the violet beams were blocked and the power of the diffracted probe beam was measured as a function of angular detuning from the Bragg angle. From these two sets of data, the angular spectrum of the grating, diffraction efficiency vs. time, and index modulation vs. time curves could be generated. The results are listed below.

The exposure to the recording beam as described above creates a diffraction grating in the material due to the creation of a pattern of refractive index changes. The diffraction efficiency listed in the tables below is a measurement of the pattern of refractive index change recorded and any number greater than zero is desirable.

EXAMPLE 1

Optical Recording Element 1

A solution of 0.9 g of the Polymer 2, 0.1 g of dibutyl phthalate (plasticizer), and 0.003 g of sensitizer S-2 in 4.0 mL of dichloromethane was hand-coated on a poly(ethylene terephthalate) support using a 125 μm doctor blade. The element was protected from UV and blue light at all times. The element was dried for 15 min. at room temperature, cut into 5×5 cm. squares, mounted in metal frames, and then dried further at 40° C. for 1 hour in a vacuum oven. The sample was exposed using the Optical Recording Procedure, above, and a diffraction efficiency of 2% was obtained.

The above results show that a pattern of refractive index change can be recorded in the materials of the invention.

Optical Recording Element 2

The procedure of Optical Recording Element 1 was followed, except using Polymer 6, and omitting dibutyl phthalate. A diffraction efficiency of 4% was obtained.

The above results show that a pattern of refractive index change can be recorded in the materials of the invention.

Optical Recording Element 3

The procedure of Optical Recording Element 1 was followed, except using Polymer 14, and omitting dibutyl phthalate. A diffraction efficiency of 0.5% was obtained.

The above results show that a pattern of refractive index change can be recorded in the materials of the invention.

Optical Recording Element 4

The procedure of Optical Recording Element 1 was followed, except using Polymer 15, and omitting dibutyl phthalate. A diffraction efficiency of 0.07% was obtained.

The above results show that a pattern of refractive index change can be recorded in the materials of the invention.

Optical Recording Element 5

The procedure of Optical Recording Element 1 was followed, except using Polymer 13. A diffraction efficiency of 0.45% was obtained.

The above results show that a pattern of refractive index change can be recorded in the materials of the invention.

This invention has been described with particular reference to preferred embodiments thereof but it will be understood that modifications can be made within the spirit and scope of the invention.

What is claimed is:

1. An optical recording material which when exposed to actinic radiation produces a change in optical properties in the exposed regions, thereby providing a pattern of intelligence for storing and retrieving information, said recording material comprising:
    a) a polymer containing a covalently bound reactant moiety, wherein the moiety is capable of undergoing a chemical transformation upon a one electron oxidation, thus causing said change in optical properties in the exposed regions; and
    b) a sensitizer capable of absorbing actinic radiation to cause an initial one electron oxidation of said reactant moiety,
    wherein the chemical transformation of the reactant moiety is an isomerization, cyclization, cycloaddition, or cycloreversion reaction.

2. The optical recording material of claim 1 wherein said reactant moiety is covalently bonded to said polymer by a linking group.

3. The optical recording element of claim 2 wherein said linking group is an alkylene, arylene, ester, carbonate, amide, ether, thioether, ketone, sulfonyl, amino, phosphonate, phosphate, or imino group.

4. The optical recording material of claim 1 wherein said sensitizer comprises from about 0.001 to about 10% by weight of said material, said reactant moiety is covalently bound to about 5 to about 100% of the repeat units of said polymer.

5. The optical recording material of claim 1 wherein said polymer is a polymethacrylate, polyacrylate, polystyrene, polyester, polyamide, polyurethane, polycarbonate, cellulose ester or poly(vinyl ester) derivative.

6. The optical recording material of claim 1 wherein said reactant moiety undergoes the following transformation:

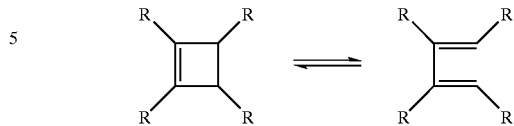

wherein each R independently represents H, a substituted or unsubstituted alkyl or alkoxy group having from about 1 to about 12 carbon atoms, a cyano group, a carboxylate group, a substituted or unsubstituted aryl group having from about 6 to about 18 carbon atoms, a substituted or unsubstituted heteroaromatic group, or two or more R groups can be joined together to form an additional ring system; at least one of said R's is covalently bonded to said polymer by a linking group.

7. The optical recording material of claim 6 wherein said reactant moiety undergoes one of the following transformations:

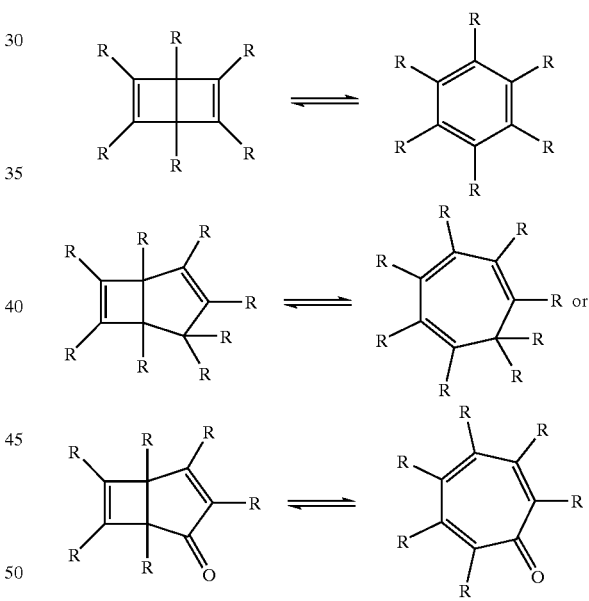

wherein each R independently represents H, a substituted or unsubstituted alkyl or alkoxy group having from about 1 to about 12 carbon atoms, a cyano group, a carboxylate group, a substituted or unsubstituted aryl group having from about 6 to about 18 carbon atoms, a substituted or unsubstituted heteroaromatic group, or two or more R groups can be joined together to form an additional ring system; at least one of said R's is covalently bonded to said polymer by a linking group.

8. The optical recording material of claim 7 wherein said reactant moiety undergoes the following transformation:

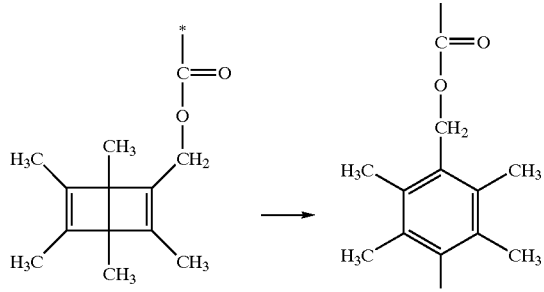

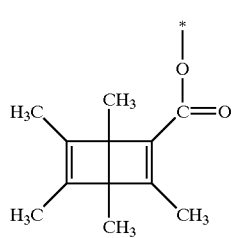

wherein * denotes the point of attachment to said polymer.

9. The optical recording material of claim 1 wherein said reactant moiety undergoes the following transformation:

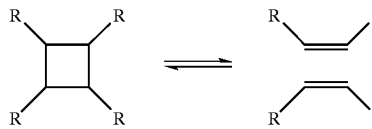

wherein each R independently represents H, a substituted or unsubstituted alkyl or alkoxy group having from about 1 to about 12 carbon atoms, a cyano group, a carboxylate group, a substituted or unsubstituted aryl group having from about 6 to about 18 carbon atoms, a substituted or unsubstituted heteroaromatic group, or two or more R groups can be joined together to form an additional ring system; at least one of said R's is covalently bonded to said polymer by a linking group.

10. The optical recording material of claim 9 wherein said reactant moiety undergoes one of the following transformations:

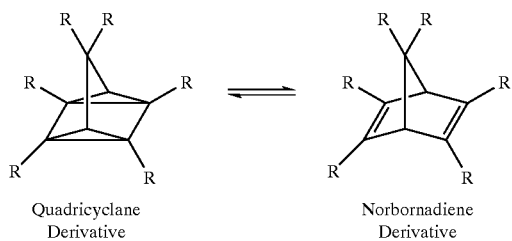

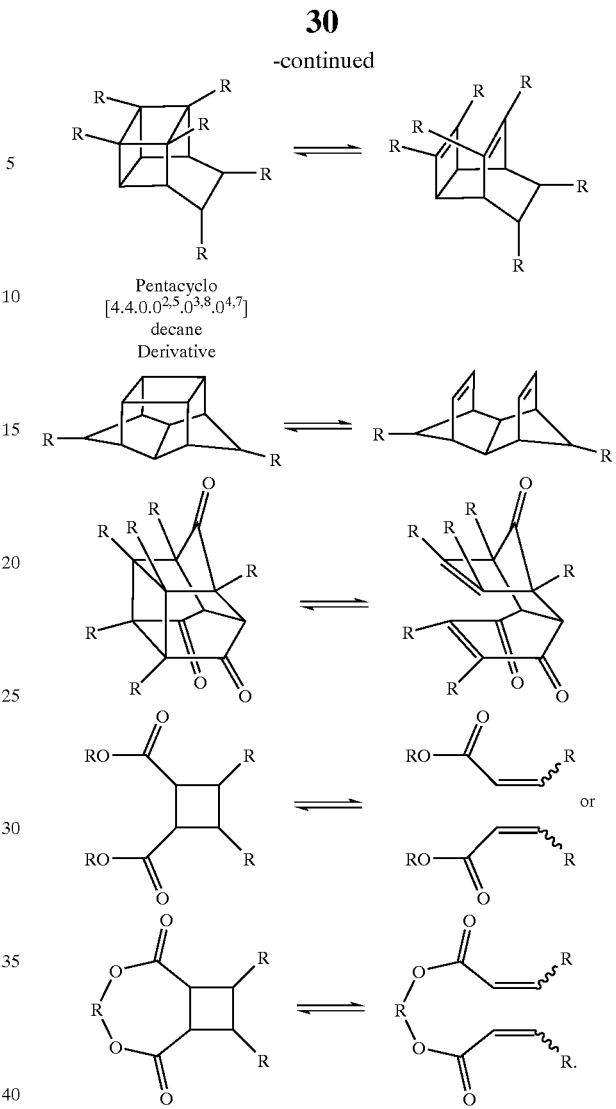

11. The optical recording material of claim 10 wherein said reactant moiety undergoes the following transformation:

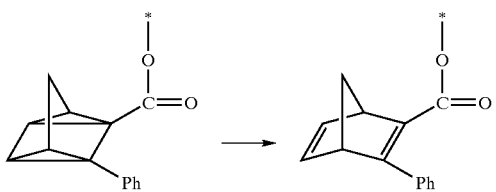

wherein * denotes the point of attachment to said polymer.

12. The optical recording material of claim 1 wherein said reactant moiety undergoes a one electron oxidation forming an oxidized reactant moiety, said oxidized reactant moiety is transformed into an oxidized product, and said oxidized product is capable of oxidizing additional said reactant moiety, thus defining the propagation of a chain reaction.

13. The optical recording material of claim 1 wherein the algebraic sum of the excitation energy of said sensitizer and its reduction potential is approximately equal to or larger than the oxidation potential of said reactant moiety, whereby said sensitizer upon absorption of said actinic radiation will be capable of accepting an electron from said reactant moiety.

14. The optical recording material of claim 13 wherein said sensitizer is a cyanoaromatic compound, a pyridinium salt, a pyryllium salt, a thiopyryllium salt, a quinone, a ketone, or a cyanine dye.

15. The optical recording material of claim 14 wherein said sensitizer is:

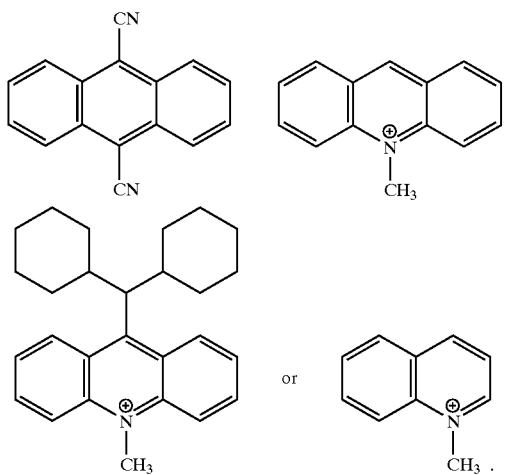

16. The optical recording material of claim 1 wherein said sensitizer upon absorption of actinic radiation reacts to produce a fragment radical cation, said fragment radical cation being capable of accepting an electron from said reactant moiety, whereby the oxidation potential of the neutral fragment is approximately equally to or greater than that of said reactant moiety.

17. The optical recording material of claim 16 wherein said sensitizer is:

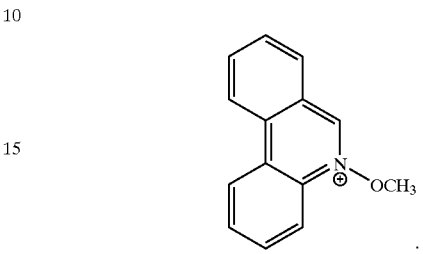

18. The optical recording material of claim 1 wherein said change in optical properties comprises a change in refractive indexes.

19. An optical recording element comprising a support having thereon the optical recording material of claim 1.

* * * * *